(12) United States Patent
Horning

(10) Patent No.: US 7,691,723 B2
(45) Date of Patent: Apr. 6, 2010

(54) BONDING SYSTEM HAVING STRESS CONTROL

(75) Inventor: Robert D. Horning, Savage, MN (US)

(73) Assignee: Honeywell International Inc., Morristown, NJ (US)

( * ) Notice: Subject to any disclaimer, the term of this patent is extended or adjusted under 35 U.S.C. 154(b) by 679 days.

(21) Appl. No.: 11/031,276

(22) Filed: Jan. 7, 2005

(65) Prior Publication Data

US 2006/0154443 A1 Jul. 13, 2006

(51) Int. Cl.
*H01L 21/30* (2006.01)
(52) U.S. Cl. ................ 438/455; 438/457; 257/E23.062
(58) Field of Classification Search ................ 438/799, 438/455, 457; 257/E23.062
See application file for complete search history.

(56) References Cited

U.S. PATENT DOCUMENTS

| | | | |
|---|---|---|---|
| 3,935,634 A | 2/1976 | Kurtz et al. | |
| 3,951,707 A | 4/1976 | Kurtz et al. | |
| 4,386,453 A | 6/1983 | Giachino et al. | |
| 4,565,096 A | 1/1986 | Knecht | |
| 4,578,735 A | 3/1986 | Knecht et al. | |
| 4,603,371 A | 7/1986 | Frick | |
| 4,609,968 A | 9/1986 | Wilner | |
| 4,632,871 A | 12/1986 | Karnezos et al. | |
| 4,701,826 A | 10/1987 | Mikkor | |
| 4,730,496 A | 3/1988 | Knecht et al. | |
| 4,852,408 A | 8/1989 | Sanders | |
| 4,899,125 A | 2/1990 | Kurtz | |
| 4,943,032 A | 7/1990 | Zdeblick | |
| 5,173,836 A | 12/1992 | Tomase et al. | |
| 5,216,631 A | 6/1993 | Sliwa, Jr. | |
| 5,264,075 A | 11/1993 | Zanini-Fisher et al. | |
| 5,307,311 A | 4/1994 | Sliwa, Jr. | |
| 5,349,492 A | 9/1994 | Kimura et al. | |
| 5,365,790 A | 11/1994 | Chen et al. | |
| 5,441,803 A * | 8/1995 | Meissner | 428/220 |
| 5,453,628 A | 9/1995 | Hartsell et al. | |
| 5,457,956 A | 10/1995 | Bowman et al. | |
| 5,473,945 A | 12/1995 | Grieff et al. | |

(Continued)

FOREIGN PATENT DOCUMENTS

JP         2001064041        3/2001

(Continued)

OTHER PUBLICATIONS

McGraw-Hill Dictionary of Scientific and Technical Terms, 2003, McGraw-Hill, Sixth Edition, p. 2131.*

(Continued)

*Primary Examiner*—Matthew C Landau
*Assistant Examiner*—Vicki B Booker
(74) *Attorney, Agent, or Firm*—Shumaker & Sieffert, P.A.

(57) ABSTRACT

An approach where items of different temperatures are bonded to each other such that upon cooling down they contract in size resulting in zero residual stress between the bonded items at an ambient temperature. If materials of the bonded items have different thermal expansion coefficients and the items are put together at different bonding temperatures, then they may have insignificant residual stress upon cooling down to the ambient temperature (e.g., room temperature) because the different ranges of the temperature drops compensate for the different contractions.

9 Claims, 2 Drawing Sheets

U.S. PATENT DOCUMENTS

| | | |
|---|---|---|
| 5,515,732 A | 5/1996 | Willcox et al. |
| 5,520,054 A | 5/1996 | Romo |
| 5,635,739 A | 6/1997 | Grieff et al. |
| 5,670,722 A | 9/1997 | Moser et al. |
| 5,695,590 A | 12/1997 | Willcox et al. |
| 5,709,337 A | 1/1998 | Moser et al. |
| 5,725,729 A | 3/1998 | Greiff |
| 5,749,226 A | 5/1998 | Bowman et al. |
| 5,770,883 A | 6/1998 | Mizuno et al. |
| 5,824,204 A | 10/1998 | Jerman |
| 5,865,417 A | 2/1999 | Harris et al. |
| 5,877,580 A | 3/1999 | Swierkowski |
| 5,891,751 A | 4/1999 | Kurtz et al. |
| 5,914,562 A | 6/1999 | Khan et al. |
| 5,917,264 A | 6/1999 | Maruno et al. |
| 5,938,923 A | 8/1999 | Tu et al. |
| 5,941,079 A | 8/1999 | Bowman et al. |
| 6,005,275 A | 12/1999 | Shinogi et al. |
| 6,018,211 A | 1/2000 | Kanaboshi et al. |
| 6,050,138 A | 4/2000 | Lynch et al. |
| 6,050,145 A | 4/2000 | Olson et al. |
| 6,071,426 A | 6/2000 | Lee et al. |
| 6,077,612 A | 6/2000 | Hagedorn et al. |
| 6,078,103 A | 6/2000 | Turner |
| 6,087,201 A | 7/2000 | Takahashi et al. |
| 6,089,099 A | 7/2000 | Sathe et al. |
| 6,111,351 A | 8/2000 | Pong et al. |
| 6,133,069 A | 10/2000 | Takahashi et al. |
| 6,140,762 A | 10/2000 | Pong et al. |
| 6,141,497 A | 10/2000 | Reinicke et al. |
| 6,143,583 A | 11/2000 | Hays |
| 6,176,753 B1 | 1/2001 | Pong et al. |
| 6,194,833 B1 | 2/2001 | DeTemple et al. |
| 6,225,737 B1 | 5/2001 | Pong et al. |
| 6,252,229 B1 | 6/2001 | Hays et al. |
| 6,258,704 B1 | 7/2001 | Turner |
| 6,268,647 B1 | 7/2001 | Takahashi et al. |
| 6,277,666 B1 | 8/2001 | Hays et al. |
| 6,310,395 B1 | 10/2001 | Takahashi et al. |
| 6,321,594 B1 | 11/2001 | Brown et al. |
| 6,323,590 B1 | 11/2001 | Pong et al. |
| 6,326,682 B1 | 12/2001 | Kurtz et al. |
| 6,328,482 B1 | 12/2001 | Jian |
| 6,349,588 B1 | 2/2002 | Brown et al. |
| 6,356,013 B1 | 3/2002 | Pong et al. |
| 6,366,468 B1 | 4/2002 | Pan |
| 6,443,179 B1 | 9/2002 | Benavides et al. |
| 6,445,053 B1 | 9/2002 | Cho |
| 6,516,671 B2 | 2/2003 | Romo et al. |
| 6,527,455 B2 | 3/2003 | Jian |
| 6,533,391 B1 | 3/2003 | Pan |
| 6,548,322 B1 | 4/2003 | Stemme et al. |
| 6,548,895 B1 | 4/2003 | Benavides et al. |
| 6,596,117 B2 | 7/2003 | Hays et al. |
| 6,605,339 B1 | 8/2003 | Marshall et al. |
| 6,621,135 B1 | 9/2003 | Sridhar et al. |
| 6,639,289 B1 | 10/2003 | Hays et al. |
| 6,647,794 B1 | 11/2003 | Nelson et al. |
| 6,660,614 B2 | 12/2003 | Hirschfield et al. |
| 6,704,111 B2 | 3/2004 | Ecklund et al. |
| 6,758,610 B2 | 7/2004 | Ziari et al. |
| 6,768,412 B2 | 7/2004 | Becka et al. |
| 6,787,885 B2 * | 9/2004 | Esser et al. ................. 257/627 |
| 6,793,829 B2 | 9/2004 | Platt et al. |
| 6,809,424 B2 | 10/2004 | Pike et al. |
| 6,811,916 B2 | 11/2004 | Mallari et al. |
| 6,821,819 B1 * | 11/2004 | Benavides et al. |
| 6,823,693 B1 * | 11/2004 | Hofmann et al. |
| 6,841,839 B2 * | 1/2005 | Sridhar et al. |
| 6,897,123 B2 * | 5/2005 | Winther ..................... 438/455 |
| 6,906,395 B2 * | 6/2005 | Smith |
| 6,910,379 B2 * | 6/2005 | Eskridge et al. |
| 6,914,785 B1 * | 7/2005 | Slocum et al. |
| 7,153,759 B2 * | 12/2006 | Wei et al. ................... 438/455 |
| 2001/0022207 A1 | 9/2001 | Hays et al. |
| 2002/0054737 A1 | 5/2002 | Jian |
| 2002/0130408 A1 | 9/2002 | Pike et al. |
| 2003/0010131 A1 | 1/2003 | Romo et al. |
| 2003/0034870 A1 | 2/2003 | Becka et al. |
| 2003/0038327 A1 | 2/2003 | Smith |
| 2003/0092243 A1 | 5/2003 | Hirschfield et al. |
| 2003/0108304 A1 | 6/2003 | Ziari et al. |
| 2003/0150267 A1 | 8/2003 | Challoner et al. |
| 2003/0160021 A1 | 8/2003 | Platt et al. |
| 2003/0178507 A1 | 9/2003 | Maria Rijn Van |
| 2003/0205089 A1 | 11/2003 | Nelson et al. |
| 2003/0226806 A1 | 12/2003 | Young et al. |
| 2004/0004649 A1 | 1/2004 | Bibl et al. |
| 2004/0008350 A1 | 1/2004 | Ecklund et al. |
| 2004/0056320 A1 | 3/2004 | Sridhar et al. |
| 2004/0081809 A1 | 4/2004 | Gomez et al. |
| 2004/0149888 A1 | 8/2004 | Costello |
| 2004/0165363 A1 | 8/2004 | Lifton et al. |
| 2004/0183189 A1 | 9/2004 | Jakobsen |
| 2004/0266048 A1 | 12/2004 | Platt et al. |
| 2005/0001182 A1 | 1/2005 | Wise et al. |
| 2005/0005676 A1 | 1/2005 | Crawley et al. |
| 2005/0011669 A1 | 1/2005 | Freeman et al. |
| 2005/0012197 A1 | 1/2005 | Smith et al. |
| 2005/0019986 A1 | 1/2005 | Pike et al. |
| 2005/0023629 A1 | 2/2005 | Ding et al. |
| 2005/0072189 A1 | 4/2005 | Tudryn et al. |
| 2005/0082581 A1 | 4/2005 | Hofmann et al. |
| 2005/0092107 A1 | 5/2005 | Eskridge et al. |
| 2005/0107658 A1 | 5/2005 | Brockway |
| 2005/0121298 A1 | 6/2005 | Sridhar et al. |
| 2005/0121735 A1 | 6/2005 | Smith |
| 2005/0139967 A1 | 6/2005 | Eskridge et al. |
| 2005/0161153 A1 | 7/2005 | Hofmann et al. |
| 2005/0172723 A1 | 8/2005 | Kato et al. |
| 2005/0178862 A1 | 8/2005 | Van Rijn |

FOREIGN PATENT DOCUMENTS

| JP | 2005317807 | 11/2005 |
|---|---|---|

OTHER PUBLICATIONS

Harz et al., "Curvature Changing or Flattening of Anodically Bonded Silicon and Borosilicate Glass", "Sensors And Actuators a Physical", Jul. 31, 1996, pp. 201-209, vol. 55, No. 2, Publisher: Elsevier Science S.A.

Karnick et al. "Honeywell Gun-Hard Inertial Measurement Unit (IMU) Development," Position Location and Navigation Symposium, 7 pages, 2004.*

* cited by examiner

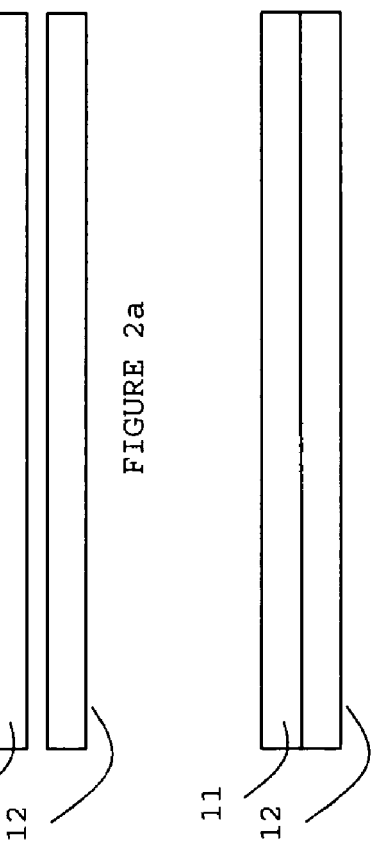
FIGURE 1a
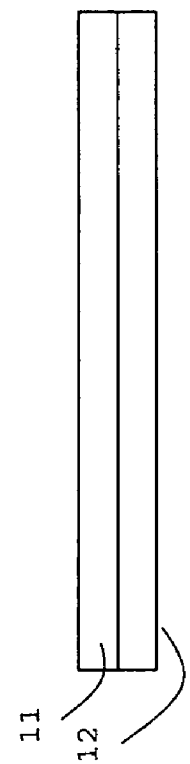
FIGURE 1b
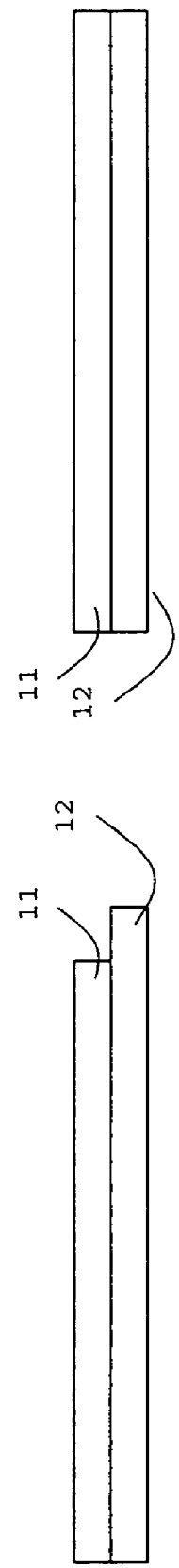
FIGURE 1c
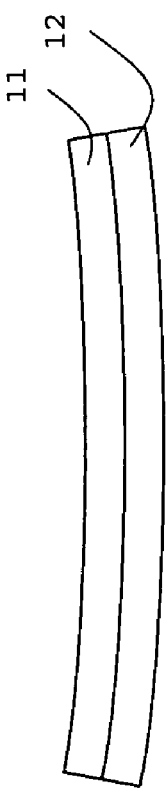
FIGURE 1d
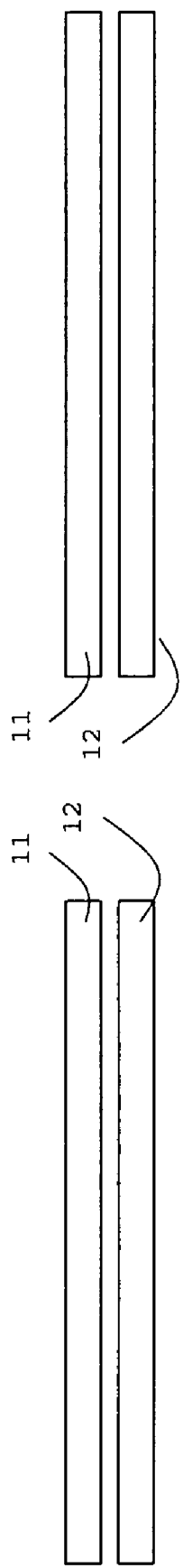
FIGURE 2a
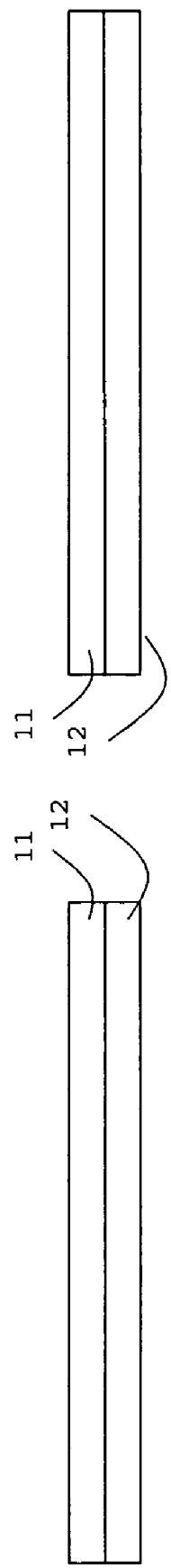
FIGURE 2b
FIGURE 2c

BONDING SYSTEM HAVING STRESS CONTROL

BACKGROUND

The present invention pertains to MEMS (micro electro mechanical systems) technology, and particularly to wafer-to-wafer bonding. More particularly, the invention pertains to stress-related bonds.

SUMMARY

The invention involves controlling the residual stress in a bonded wafer. Usually the goal is to minimize or virtually eliminate residual stress in wafer bonds.

BRIEF DESCRIPTION OF THE DRAWINGS

FIGS. 1a, 1b, 1c and 1d reveal a stress-impacted bonding of two wafers;

FIGS. 2a, 2b and 2c reveal a stress-free bonding of two wafers; and

DESCRIPTION

Figure 3:
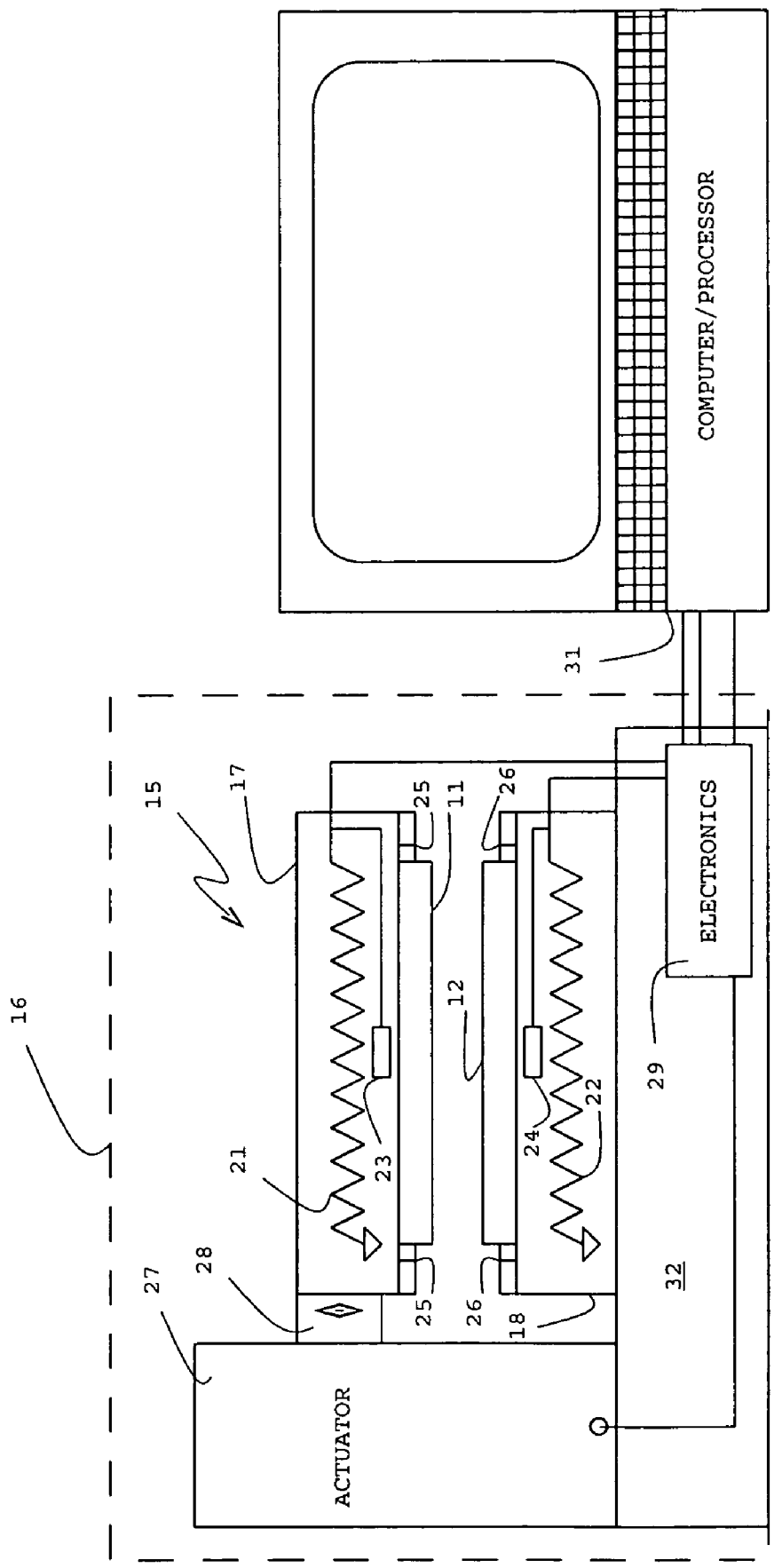
FIG. 3 reveals a bonder for implementing stress-free bonds between wafers.

Anodic bonding is a method of joining glass to silicon without the use of adhesives. The silicon and glass wafers may be heated to a temperature (typically in the range 300 to 500 degrees C. depending on the glass type) at which the alkali-metal ions in the glass become mobile. The components may be brought into contact and a high voltage applied across them. This causes the alkali cations to migrate from the interface resulting in a depletion layer with high electric field strength. The resulting electrostatic attraction brings the silicon and glass into intimate contact. Further current flow of the oxygen anions from the glass to the silicon may result in an anodic reaction at the interface in that the glass becomes bonded to the silicon with a permanent chemical bond.

Anodic bonding, a fabrication technique commonly used in MEMS fabrication and used, in particular, for MEMS gyroscopes and accelerometers, typically results in residual stress in the bonded wafers and devices. Since the wafers are different materials, they have different rates of thermal expansion. Therefore, when the resultant bonded wafer is cooled from the bonding temperature, the two materials bonded to each other in the wafer contract at different rates resulting in significant residual stress. The temperature differential technique may be used for various types of attachment and bonding. The residual stress may be minimized or nearly eliminated. For instance, the wafers may be held at slightly different temperatures during bonding. Upon cooling down, the bonded wafers may contract at different rates and result in having an insignificant amount of residual stress between the wafers at ambient or room temperature.

Anodic bonding may be used in MEMS for joining one wafer to another, or for bonding a chip to a package (such as a glass enclosure). In general, anodic bonding may be used to join a metal or semiconductor to glass. In MEMS, the semiconductor may be silicon and the glass may be Corning 7740 (i.e., Pyrex™), Hoya SD2, or the like.

Anodic bonding is an illustrative example. There are various other wafer bonding techniques, such as "fusion" or "direct" bonding, frit bonding, eutectic bonding, and the like, which may be used with the present bonding system having stress control at the interface of the bonded materials.

One concern with bonding in general is that two different materials (e.g., silicon and Pyrex™) may be bonded at an elevated temperature, typically from about 300 to 500 degrees C. The materials may be heated up, bonded together, and then cooled back down to room temperature. As the combined materials (i.e., in a wafer or device) cool down, the difference between the thermal expansion of the two materials may result in a stress between the two materials attached to each other. When the materials are in wafer form, the stress may cause the resultant wafer to bow significantly. When the fabrication is complete, there may be a residual stress that remains between the glass portion of the device and the silicon portion of the device. Such stress may lead to layout difficulties, device performance problems, long term drifts, and/or poor reliability.

It would be desirable to bond two different materials that have exactly the same thermal expansion over the entire temperature range during bonding and device operation. However, no such two different materials appear to exist. Pyrex™ is regarded as thermally matching quite well with silicon. Despite these close thermal expansions, there still may be notable stress between the materials after bonding. Glass such as Hoya™ MSD2 may be a better match for silicon. However, for various reasons, Pyrex™ could be the material of choice for bonding with silicon. Thus, bow and residual stress may be always present.

The invention is an approach for achieving a bond with virtually no residual stress at room temperature. An example bond may be between two materials such as silicon wafer 11 and Pyrex™ wafer 12. The room temperature stress may be changed by holding the silicon wafer 11 at one temperature and the Pyrex™ wafer 12 at a different temperature at bonding time. One reason this approach works is because different differentials or changes of temperatures between bonding and a cooled-off state may compensate for the different coefficients of thermal expansion. Wafer 11 and wafer 12 at a bonding temperature (much higher than room temperature) may be matched in length before bonding (FIG. 1a). Since the wafers 11 and 12 are at the same temperature and not constrained during heating, they may be stress free when first bonded together (FIG. 1b). As the wafers 11 and 12 cool down to room temperature, they may contract. If they are bonded well to each other, the wafers 11 and 12 may contract to shorter lengths. However, even though the lengths of wafers 11 and 12 were the same at the bonding temperature, the wafers may contract to different lengths at room temperature because of the different coefficients of thermal expansion of silicon and Pyrex™ (FIG. 1c).

If $\alpha_1$ is the thermal expansion coefficient of wafer 11, then as the wafer cools it may contract by an amount of $\Delta L_1 = \alpha_1 L_1 \Delta T$. Similarly, wafer 12 may contract by an amount $\Delta L_2 = \alpha_2 L_2 \Delta T$. Since $L_1 = L_2$ when the wafers are at bonding temperature, the amount of contraction may differ between wafers 11 and 12 in that $L_1 \neq L_2$ when the wafers are at room temperature. However, if the wafers are bonded to each other, they may be constrained to contract by the same amount. The resultant constraint may lead to a residual stress and bow of the wafers 11 and 12 (FIG. 1d).

One may use a simplification that the thermal expansion coefficient does not change with temperature. In reality, the thermal expansion coefficient generally does change with temperature, but the conclusions would be still the same as if one used the simplification. The thermal expansion coefficient may be defined as $\alpha = (1/L)(\Delta L/\Delta T)$, where L is the length of the sample, and $\Delta L$ is the length change when the temperature changes by $\Delta T$. Examples of linear thermal coefficients of expansion $a_1$ and $\alpha_2$ for silicon and Pyrex™ glass may be 3 and 4 parts per million per Celsius degree, respectfully.

For a silicon wafer having a length of ten centimeters, a room temperature of 20 degrees C. and a bonding temperature of 420 degrees C., $\Delta L_1 = \alpha_1 L_1$, $\Delta T = 3 \times 10^{-6}$ ppm $\times 10$ cm $\times 400$ deg C. $= 1200 \times 10^{-5}$ cm $= 1.2 \times 10^{-2}$ cm. For a Pyrex™ glass wafer having a length of ten centimeters, a room temperature of 20 degrees C. and a bonding temperature of 420 degrees C., $\Delta L_2 = \alpha_2 L_2 \Delta T = 4 \times 10^{-6}$ ppm $\times 10$ cm $\times 400$ deg C. $= 1600 \times 10^{-5}$ cm $= 1.6 \times 10^{-2}$ cm. The difference of expansions may be $\Delta L_2 - \Delta L_1 = 4 \times 10^{-3}$ cm.

Next, one may note a case where wafers 11 and 12 are held at two different temperatures for and during bonding. Then the temperature changes upon cooling of wafers 11 and 12 from the bond temperatures to the room temperature, respectively, may be different. So the applicable formulas may be $\Delta L_1 = \alpha_1 L_1 \Delta T_1$ and $\Delta L_2 = \alpha_2 L_2 \Delta T_2$. As noted before, $L_1 = L_2$, but temperatures of wafers 11 and 12 may be chosen such that $\alpha_1 \Delta T_1 = \alpha_2 \Delta T_2$ or $\alpha_1 \Delta T_1 \approx \alpha_2 \Delta T_2$ and thus $\Delta L_1 = \Delta L_2$ or $\Delta L_1 \approx \Delta L_2$, respectively. In FIG. 2a, wafer 11 may be at $T_1$ and wafer 12 at $T_2$, where $T_1$ and $T_2$ are the bonding temperatures before bonding. In FIG. 2b, the bonding temperatures $T_1$ and $T_2$ may be maintained while the wafers 11 and 12 are bonded to each other. As the temperature is reduced from the bonding temperature in FIG. 2b to an ambient, pre-bonding, operating, storage, normal, or room temperature after bonding in FIG. 2c, each wafer undergoes the same length change and thus there is no residual stress in and no bowing of the bonded wafer pair at room temperature.

The bonding temperatures difference between wafers 11 and 12 is not necessarily large. Such temperature difference may be achieved with bonding equipment.

The approach may be more complicated if the thermal expansion coefficients are temperature dependent. This may make the mathematics more involved, but the extensive calculation would not generally qualitatively change the result. While the desire may typically be to achieve minimum stress at room temperature, the present approach may also be used to achieve any targeted, nonzero stress in the combined wafers 11 and 12. The concept remains the same. The starting temperatures just before bonding may be adjusted appropriately to get the targeted stress.

Wafer bonders may be equipped with a heater on both the top side and the bottom side of the wafer stack. The heaters may be independently controlled, allowing the temperatures of the top and bottom wafers to be set independently. Further, bonding the wafers in a vacuum may reduce the thermal contact between the wafers, thus making it easier to vary the wafer temperatures independently than if the wafer bonding were done in an air environment.

The above-described bonding approaches may be applied to many kinds of devices and products. Examples may include MEMS gyroscopes, MEMS accelerometers, MEMS inertial measurement devices, non-MEMS devices, and so forth.

In FIG. 3 is a bonder 15 that may be in an enclosure 16. Enclosure 16 may be capable of holding bonder 15 in a vacuum. A holder 17 may secure wafer or item 11 into a position with a clamp 25. Holder 18 may secure wafer or item 12 into a position with a clamp 26. Clamps 25 and 26 may hold wafers 11 and 12, respectively, at the edges so that the facing surfaces of wafers 11 and 12 can come in contact without interference. Clamps 25 and 26 may be spring-loaded, or otherwise, so as to maintain an appropriate grasp on the wafers when they expand or contract. Clamps 25 and 26 are such that the wafers may be grasped and released with ease either manually, pneumatically, mechanically or electronically.

Item 11 may be heated to a bonding temperature $T_1$ by a heater element 21. Item 12 may be heated to a bonding temperature $T_2$ by a heater element 22. $T_1$ may be sensed by a temperature sensor 23 and $T_2$ may be sensed by a temperature sensor 24. Actuator 27 may have an arm 28 attached to holder 17 to move holder 17 towards or away from wafer holder 18 so as to bring wafers 11 and 12 together for bonding, or apart prior to bonding for placement of the wafers, or after bonding for release of the bonded wafers.

An electronics module 29 in bonder 15 may be an interface between bonder 15 and computer/processor 31. Computer or processor 31 may be programmable so that the wafers or item 11 and 12 may be bonded resulting in a predetermined amount of stress between them at an ambient, pre-bonding, operating, storage or room temperature after bonding. The predetermined amount of stress may be selected to be insignificant or virtually zero. The heaters 21 and 22, temperature sensors 23 and 24, and actuator 27 may be connected to the computer or processor 31 via electronics 29, or electronics 29 may be designed so as to control the temperature of the wafers or items 11 and 12 for bonding. In lieu of the computer or processor 31, electronics 29 may be designed to be programmable for setting the amount of stress desired between the resultant bonded wafers or items 11 and 12. Certain external controls may be connected to electronics 29 for user interfacing. Electronics 29 may be situated in or attached to a base 32 along with holder 18 and actuator 27.

In the present specification, some of the material may be of a hypothetical or prophetic nature although stated in another manner or tense.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A method for bonding comprising:
providing a first material;
providing a second material in direct physical contact with the first material;
heating the first material to a first temperature; and
heating the second material to a second temperature;
wherein:
the first temperature and the second temperature are different, and wherein the first and second temperatures are sufficient for bonding the first and second materials and wherein the first and second materials are bonded to each other while maintaining the first and second temperatures, respectively;
a change in size of the first material from a room temperature to the first temperature is a first percentage;
a change in size of the second material from the room temperature to the second temperature is a second percentage; and
the second percentage is approximately the same as the first percentage.

2. The method of claim 1, further comprising cooling the first and second materials to a third temperature.

3. The method of claim 2, wherein:
a bonding of the first and second materials results in a multi-layer wafer; and the third temperature is an operating temperature of the multi-layer wafer.

4. The method of claim 3, wherein the first and second materials have different thermal expansion coefficients.

5. The method of claim 3, wherein:
the first material is silicon; and
the second material is glass.

6. The method of claim 5, wherein the glass is a borosilicate glass.

7. The method of claim 4, wherein the first and second materials are materials used in a micro electro mechanical system (MEMS).

8. The method of claim 1, wherein the first and second materials are components of a micro electro mechanical system (MEMS).

9. The method of claim 1, wherein one of the first temperature and the second temperature is in the range of about 300 to 500 degrees Celsius.

* * * * *

UNITED STATES PATENT AND TRADEMARK OFFICE
CERTIFICATE OF CORRECTION

PATENT NO. : 7,691,723 B2
APPLICATION NO. : 11/031276
DATED : April 6, 2010
INVENTOR(S) : Robert D. Horning It is certified that error appears in the above-identified patent and that said Letters Patent is hereby corrected as shown below:

Column 2, Line 23, "as Hoya$^{TM}$ MSD2 may be" should read -- as Hoya$^{TM}$ SD2 may be --

Column 3, Line 1, "of expansion a , and $\alpha_2$" should read -- of expansion $\alpha_1$, and $\alpha_2$ --

Signed and Sealed this

Sixteenth Day of November, 2010

David J. Kappos
*Director of the United States Patent and Trademark Office*